(12) United States Patent
Lee

(10) Patent No.: US 8,420,532 B2
(45) Date of Patent: Apr. 16, 2013

(54) METHOD OF MANUFACTURING SEMICONDUCTOR DEVICE

(75) Inventor: Sung Hoon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 615 days.

(21) Appl. No.: 11/962,442

(22) Filed: Dec. 21, 2007

(65) Prior Publication Data

US 2009/0004842 A1 Jan. 1, 2009

(30) Foreign Application Priority Data

Jun. 29, 2007 (KR) .................. 10-2007-0065025

(51) Int. Cl.
*H01L 21/4763* (2006.01)
*H01L 21/44* (2006.01)
*H01L 21/311* (2006.01)

(52) U.S. Cl.
USPC .................. 438/672; 438/618; 438/700

(58) Field of Classification Search ............. 438/618, 438/597, 598, 669–677, 700–703
See application file for complete search history.

(56) References Cited

U.S. PATENT DOCUMENTS

| | | | | |
|---|---|---|---|---|
| 5,834,162 A | * | 11/1998 | Malba | 430/317 |
| 6,071,773 A | * | 6/2000 | Lee et al. | 438/253 |
| 6,358,842 B1 | * | 3/2002 | Zhou et al. | 438/633 |
| 6,458,705 B1 | * | 10/2002 | Hung et al. | 438/692 |
| 6,808,984 B1 | * | 10/2004 | Chen | 438/256 |
| 2002/0001778 A1 | * | 1/2002 | Latchford et al. | 430/313 |
| 2004/0157465 A1 | * | 8/2004 | Kawai | 438/736 |
| 2004/0264240 A1 | * | 12/2004 | Hineman et al. | 365/158 |
| 2005/0085069 A1 | * | 4/2005 | Lin et al. | 438/638 |
| 2005/0118800 A1 | * | 6/2005 | Brakensiek et al. | 438/633 |
| 2007/0010088 A1 | | 1/2007 | Ho | |
| 2007/0020829 A1 | * | 1/2007 | Hotta et al. | 438/172 |

FOREIGN PATENT DOCUMENTS

| | | | |
|---|---|---|---|
| JP | 11176935 A | * | 7/1999 |
| JP | 2001-168188 | | 6/2001 |
| JP | 2001168191 A | * | 6/2001 |
| KR | 10-0664780 | | 1/2007 |

* cited by examiner

*Primary Examiner* — Charles Garber
*Assistant Examiner* — Calvin Choi
(74) *Attorney, Agent, or Firm* — Marshall, Gerstein & Borun LLP

(57) ABSTRACT

The present invention relates to a method of fabricating a semiconductor device. According to the method, a first insulating layer having a contact hole formed therein is formed over a semiconductor substrate. A second insulating layer is gap filled within the contact hole. A third insulating layer having a trench formed therein is formed over the semiconductor substrate including the contact hole. The second insulating layer gap filled within the contact hole is removed. A contact plug and a bit line are formed within the contact hole and the trench.

16 Claims, 3 Drawing Sheets

METHOD OF MANUFACTURING SEMICONDUCTOR DEVICE

CROSS-REFERENCES TO RELATED APPLICATIONS

The priority of Korean patent application number 10-2007-65025, filed on Jun. 29, 2007, is hereby claimed and the disclosure thereof is incorporated herein by reference in its entirety.

BACKGROUND OF THE INVENTION

The present invention relates to a method of fabricating a semiconductor device and, more particularly, to a method of fabricating a semiconductor device to improve a contact hole gap filling characteristic.

As semiconductor devices shrink, the width of a contact hole is decreased. The width of the contact hole is reduced, whereas the height of the contact hole is increased. Thus, when performing a process of gap filling the contact hole with a conductive layer, the contact hole is not properly gap filled with the conductive layer. Due to this problem, contact short occurs between the contact hole and a bit line. Consequently, erase failure is generated in a device operation and the yield is decreased.

In semiconductor devices of 60 nm or less, tungsten (W) is used as the material of a contact plug. In this case, an adhesion phenomenon occurs in which the tungsten (W) layer is not properly brought in contact with an insulating layer having a contact hole formed therein. Therefore, a titanium (Ti)-based barrier metal layer must be formed in order to prevent the adhesion phenomenon.

However, in a process of depositing the titanium (Ti)-based barrier metal layer within the contact hole, overhang occurs at an upper entry of the contact hole since the width of the contact hole is narrow. At this time, if the contact hole is gap filled with the conductive layer using a subsequent process by narrowing the upper entry of the contact hole in order to prevent such overhang, the contact hole is not fully gap filled with the conductive layer material due to overhang of the barrier metal layer formed at the upper entry of the contact hole, thus generating void. In this state, if a Chemical Mechanical Polishing (CMP) process is performed until the insulating layer is exposed, the void generated within the contact hole is exposed. Consequently, a poor contact problem with a bit line that is formed subsequently is generated.

BRIEF SUMMARY OF THE INVENTION

According to the present invention, a damascene pattern comprised of a contact hole and a trench is formed in order to form a contact plug and a bit line at the same time. Thus, since an upper entry region of the damascene pattern is wide, overhang can be prevented from occurring at the upper entry region of the contact hole. Accordingly, a poor contact problem between the contact plug and the bit line can be improved.

A method of fabricating a semiconductor device according to an embodiment of the present invention includes forming over a semiconductor substrate a first insulating layer having a contact hole formed therein, gap filling a second insulating layer within the contact hole, forming a third insulating layer having a trench formed therein over the semiconductor substrate including the contact hole, removing the second insulating layer gap filled within the contact hole, and forming a contact plug and a bit line within the contact hole and the trench.

A first etch-stop layer may be further formed between the semiconductor substrate and the first insulating layer. The first etch-stop layer preferably is formed from a silicon nitride (SiN) layer, a silicon oxynitride (SiON) layer or a silicon (Si) layer.

The first insulating layer preferably is formed from any one of a High Density Plasma (HDP) oxide layer, a Tetra Ethyl Ortho Silicate (TEOS) oxide layer, and a Spin On Glass (SOG) oxide layer, or a stacked layer of two or more members of the group consisting of the HDP oxide layer, the TEOS oxide layer, and the SOG oxide layer. A second etch-stop layer preferably is further formed on the first insulating layer. The second etch-stop layer preferably is formed from a SiN layer, a SiON layer or a Si layer. In the contact hole formation process, the second etch-stop layer may be used as a hard mask.

A passivation layer may be further formed on sidewalls of the contact hole. The passivation layer preferably is formed from a SiN layer, a SiON layer or a Si layer. The second insulating layer preferably is formed from material that can be removed by an ashing process. The second insulating layer preferably is formed from an amorphous carbon layer.

The trench may have a width wider than that of the contact hole. The contact hole and the trench may constitute a damascene pattern. The contact plug preferably is formed from a tungsten layer. The bit line preferably is formed from a tungsten layer.

The process of forming the contact plug and the bit line may includes gap filling a conductive layer within the contact hole and the trench, and performing a CMP process until the third insulating layer is exposed, in order to form the contact plug and the bit line at the same time.

DESCRIPTION OF SPECIFIC EMBODIMENTS

Now, a specific embodiment according to the present invention will be described with reference to the accompanying drawings.

However, the present invention is not limited to the disclosed embodiment, but may be implemented in various manners. The embodiment is provided to complete the disclosure of the present invention and to allow those having ordinary skill in the art to understand the present invention. The present invention is defined by the claims.

Figure 1A:
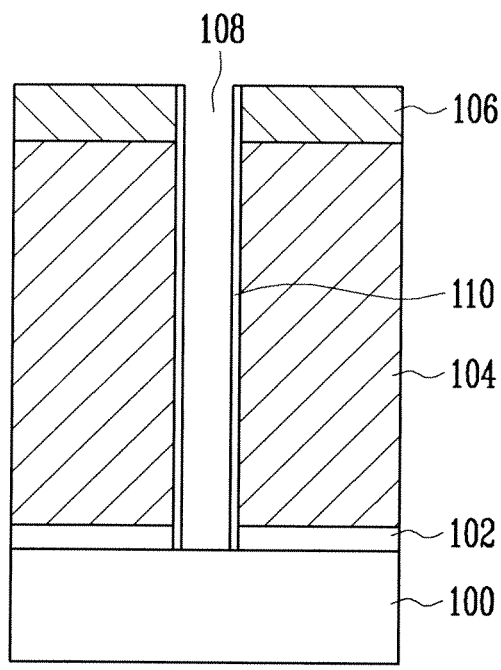
FIGS. 1A to 1E are sectional views illustrating a method of fabricating a semiconductor device according to an embodiment of the present invention.

Referring to FIG. 1A, a first etch-stop layer 102 is formed over a semiconductor substrate 100 in which semiconductor elements (not shown), such as an isolation layer, a transistor and a flash memory cell, are formed. The first etch-stop layer 102 preferably is formed from a SiN layer, a SiON layer or a Si layer.

A first insulating layer 104 is formed on the first etch-stop layer 102. A CMP process is performed in order to polish the first insulating layer 104. The first insulating layer 104 preferably is formed from any one of a HDP oxide layer, a TEOS oxide layer, and a SOG oxide layer, or it may have a stacked layer of two or more of them.

A second etch-stop layer 106 is formed on the first insulating layer 104. The second etch-stop layer 106 preferably is formed from a SiN layer, a SiON layer or a Si layer.

The second etch-stop layer 106, the first insulating layer 104, and the first etch-stop layer 102 are etched using an etch process in order to form a contact hole 108 through which the semiconductor substrate 100 is exposed. When the process of forming the contact hole 108 is performed, the second etch-stop layer 106 may be used as a hard mask.

A passivation layer 110 is formed over the entire surface including over the first insulating layer 104 and the inside of the contact hole 108. Thereafter, the passivation layer 110 formed over the first insulating layer 104 and on the bottom of the contact hole 108 are removed, so the passivation layer 110 remains only on the sidewalls of the first etch stop layer 102, the first insulating layer 104, and the second etch stop layer 106, while exposing the semiconductor substrate 100. The passivation layer 110 preferably is formed from a SiN, SiON or Si oxide layer. The passivation layer 110 functions to prevent the first insulating layer 104 from being damaged in a subsequent cleaning process.

Figure 1B:
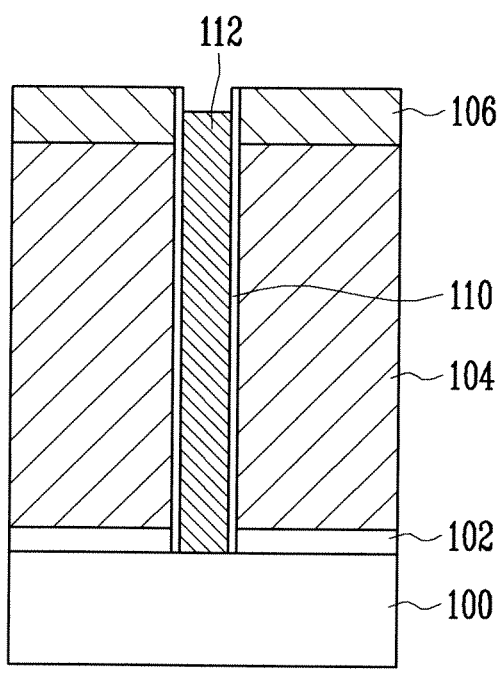

Referring to FIG. 1B, a second insulating layer 112 is formed over the semiconductor substrate 100 including the contact hole 108. The second insulating layer 112 formed on the second etch-stop layer 106 is removed using a blanket etch process. In this embodiment, the second insulating layer 112 preferably is formed from a material on which a thermal process can be performed when a third insulating layer formation process is performed subsequently, and that can be removed using an ashing process, preferably, an amorphous carbon layer. The second insulating layer 112 functions to protect the inside of the contact hole 108 when a process of forming a bit line pattern (that is, a subsequent process) is performed.

Figure 1C:
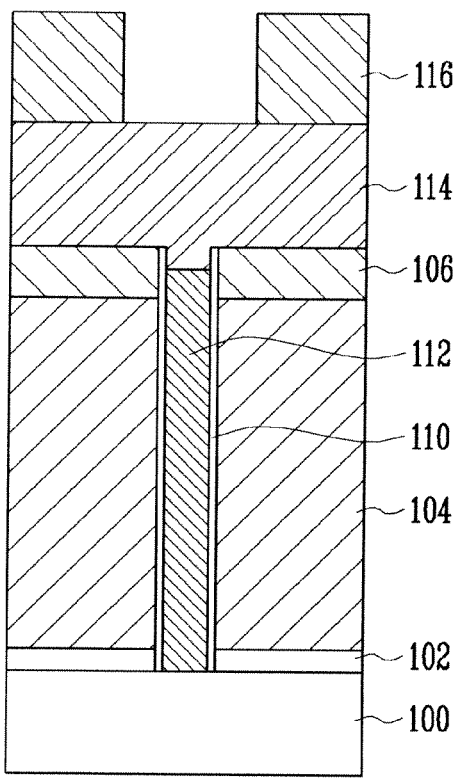

Referring to FIG. 1C, a third insulating layer 114 and a first photoresist pattern 116 are formed over the second etch-stop layer 106 and the second insulating layer 112. The third insulating layer 114 preferably is formed from oxide.

Figure 1D:
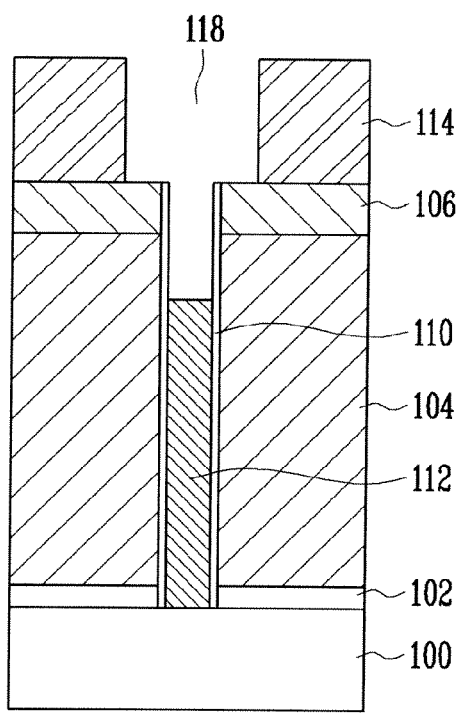

Referring to FIG. 1D, the third insulating layer 114 is etched using the first photoresist pattern 116 as an etch mask, thus forming a trench 118 through which the contact hole 108 and the second etch-stop layer 106 formed near the contact hole 108 are partially exposed. In the etch process of the third insulating layer 114, part of the second insulating layer 112 gap filled within the contact hole 108 is also etched. The first photoresist pattern 116 is then removed.

Figure 1E:
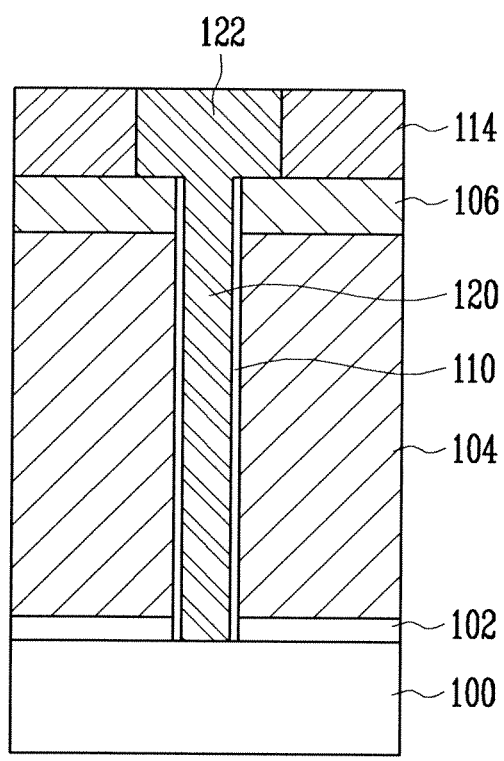

Referring to FIG. 1E, an ashing process is performed in order to remove the second insulating layer 112 remaining within the contact hole 108. Accordingly, a damascene pattern comprised of the contact hole 108 and the trench 118 is formed.

Thereafter, a conductive layer is gap filled on the semiconductor substrate 100 including the damascene pattern. A CMP process is then performed until the third insulating layer 114 is exposed, thus forming a contact plug 120 and a bit line 122 at the same time. The conductive layer may be formed from a tungsten (W) layer.

As described above, the damascene pattern comprised of the contact hole 108 and the trench 118 is formed. Thus, in the process of gap filling the conductive layer within the damascene pattern, an upper entry region of the damascene pattern is widened and therefore overhang can be prevented from occurring at the upper entry region of the contact hole 108. Accordingly, the damascene pattern can be gap filled without void.

Furthermore, the contact plug 120 and the bit line 122 are formed at the same time by filling the damascene pattern comprised of the contact hole 108 and the trench 118. Thus, a poor contact phenomenon between a contact plug 120 and a bit line 122 can be improved. Consequently, a poor yield due to erase failure can be improved.

As described above, the present invention may have one or more of the following advantages.

First, since the damascene pattern comprised of the contact hole and the trench is formed, the upper entry region of the damascene pattern becomes wide in the process of gap filling the conductive layer within the damascene pattern. Accordingly, the occurrence of overhang at the upper entry region of the contact hole can be prevented.

Second, the damascene pattern can be gap filled without void since the occurrence of overhang is prevented.

Third, the contact plug and the bit line are formed at the same time by filling the damascene pattern comprised of the contact hole and the trench. Accordingly a poor contact problem between the contact plug and the bit line can be improved.

Fourth, since a poor contact problem between the contact plug and the bit line can be improved, a poor yield due to erase failure can be improved.

What is claimed is:

1. A method of fabricating a semiconductor device, the method comprising:
    forming a first insulating layer over a semiconductor substrate;
    forming a contact hole in the first insulating layer;
    forming a second insulating layer over an entire resulting structure including the contact hole to fill the contact hole;
    removing a portion of the second insulating layer so that the second insulating layer remains within the contact hole;
    forming a third insulating layer over the first and second insulating layers;
    forming a trench in the third insulating layer so that the second insulating layer is exposed;
    removing the second insulating layer within the contact hole; and
    filling the contact hole and the trench with a conductive material to form a contact plug and a bit line.

2. The method of claim 1, comprising further forming a first etch-stop layer between the semiconductor substrate and the first insulating layer.

3. The method of claim 2, comprising forming the first etch-stop layer from a silicon nitride (SiN) layer, a silicon oxynitride (SiON) layer or a silicon (Si) layer.

4. The method of claim 1, comprising forming the first insulating layer from any one of a High Density Plasma (HDP) oxide layer, a Tetra Ethyl Ortho Silicate (TEOS) oxide layer, and a Spin On Glass (SOG) oxide layer, or a stacked layer of two or more of the HDP oxide layer, the TEOS oxide layer, and the SOG oxide layer.

5. The method of claim 1, further comprising forming a second etch-stop layer on the first insulating layer.

6. The method of claim 5, comprising forming the second etch-stop layer from a SiN layer, a SiON layer or a Si layer.

7. The method of claim 5, comprising using the second etch-stop layer as a hard mask in the contact hole formation process.

8. The method of claim 1, further comprising forming a passivation layer on sidewalls of the contact hole.

9. The method of claim 8, comprising forming the passivation layer from a SiN layer, a SiON layer or a Si layer.

10. The method of claim 1, comprising forming the second insulating layer from a material that can be removed by an ashing process.

11. The method of claim 1, comprising forming the second insulating layer from an amorphous carbon layer.

12. The method of claim 1, comprising forming the trench with a width wider than that of the contact hole.

13. The method of claim 1, wherein the contact hole and the trench constitute a damascene pattern.

14. The method of claim 1, comprising forming the contact plug from tungsten.

15. The method of claim 1, comprising forming the bit line from tungsten.

16. The method of claim 1, wherein the process of forming the contact plug and the bit line comprises:
   gap filling a conductive layer within the contact hole and the trench; and
   performing a CMP process until the third insulating layer is exposed, to form the contact plug and the bit line.

* * * * *